(12) United States Patent
Eimori

(10) Patent No.: US 6,740,584 B2
(45) Date of Patent: *May 25, 2004

(54) SEMICONDUCTOR DEVICE AND METHOD OF FABRICATING THE SAME

(75) Inventor: Takahisa Eimori, Tokyo (JP)

(73) Assignee: Mitsubishi Denki Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/935,786

(22) Filed: Sep. 23, 1997

(65) Prior Publication Data

US 2002/0056913 A1 May 16, 2002

(30) Foreign Application Priority Data

Mar. 27, 1997 (JP) .............................................. 9-076200

(51) Int. Cl.$^7$ .......................................... H01L 21/4763
(52) U.S. Cl. ....................... 438/638; 438/640; 438/637; 438/739; 438/713
(58) Field of Search ................................ 257/758, 760, 257/773, 774, 306, 637, 641, 649; 438/638, 640, 701, 739, 637, 713, 706, 745, 629

(56) References Cited

U.S. PATENT DOCUMENTS

| 4,634,494 A | | 1/1987 | Taji et al. | |
|---|---|---|---|---|
| 5,246,882 A | * | 9/1993 | Hartmann | .................... 437/195 |
| 5,246,883 A | | 9/1993 | Lin et al. | |

(List continued on next page.)

FOREIGN PATENT DOCUMENTS

| DE | 3914602 | | 11/1990 | |
|---|---|---|---|---|
| JP | 63-182839 | | 7/1988 | |
| JP | 64-2335 | | 1/1989 | |
| JP | 1-274419 | | 11/1989 | |
| JP | 402026020 | * | 1/1990 | ................. 438/363 |
| JP | 09-045768 | | 2/1997 | |

OTHER PUBLICATIONS

F.Y. Huang, Shawn G. Thomas, Michael Chu, and Kang L. Wang, "Epitaxial SiGeC/Si Photodetector With Response In The 1.3–1.55 μm Wavelength Range," IEEE, International Electron Devices Meeting, 1996, pp. 26.6.1–26.6.4.

Microscopic Uniformity In Plasma Etching, by Richard A. Gottscho and C.W. Jurgenson pp. 2133–2147.

A High Density 4Mbit dRAM Process Using a Fully Overlapping Bitline Contact (FoBIC) Trench Cell pp. 92–93.

A New Self–Aligned Contact Technology for LDD MOS Transistors pp. 29–32.

3–Dimensional Stacked Capacitor Cell for 16M and 64M Drams.

Primary Examiner—Tom Thomas
Assistant Examiner—Ori Nadav
(74) Attorney, Agent, or Firm—McDermott, Will & Emery

(57) ABSTRACT

A lower portion of an interlayer insulating film is formed contiguous with a semiconductor wafer. The lower portion has a high impurity concentration and a high etching rate. An upper portion of an interlayer insulating film is formed over the lower portion apart from the semiconductor wafer. The upper portion has a low impurity concentration and a low etching rate. A plurality of contact holes are formed through the interlayer insulating film by anisotropic etching. The bottom portion of each contact hole is expanded by isotropic etching, and a contact is formed in the contact hole. Thus, a satisfactory contact is formed in a hole of a large aspect ratio.

4 Claims, 12 Drawing Sheets

U.S. PATENT DOCUMENTS

| | | | |
|---|---|---|---|
| 5,275,963 A | * | 1/1994 | Cederbaum et al. ........... 437/48 |
| 5,275,972 A | * | 1/1994 | Ogawa et al. .............. 438/639 |
| 5,332,924 A | * | 7/1994 | Kobayashi .................. 257/760 |
| 5,479,054 A | * | 12/1995 | Tottori ........................ 257/760 |
| 5,532,191 A | | 7/1996 | Nakano et al. |
| 5,631,184 A | * | 5/1997 | Ikemasu et al. ............ 438/397 |
| 5,677,557 A | * | 10/1997 | Wuu et al. ................... 257/377 |
| 5,825,059 A | * | 10/1998 | Kuroda ....................... 257/301 |
| 5,841,195 A | * | 11/1998 | Lin et al. .................... 257/774 |
| 5,877,541 A | * | 3/1999 | Sardella et al. ............. 257/637 |
| 5,994,762 A | * | 11/1999 | Suwanai et al. ............ 257/637 |
| 6,180,450 B1 | * | 1/2001 | Dennison et al. ........... 438/254 |

* cited by examiner

*FIG.20  PRIOR ART*
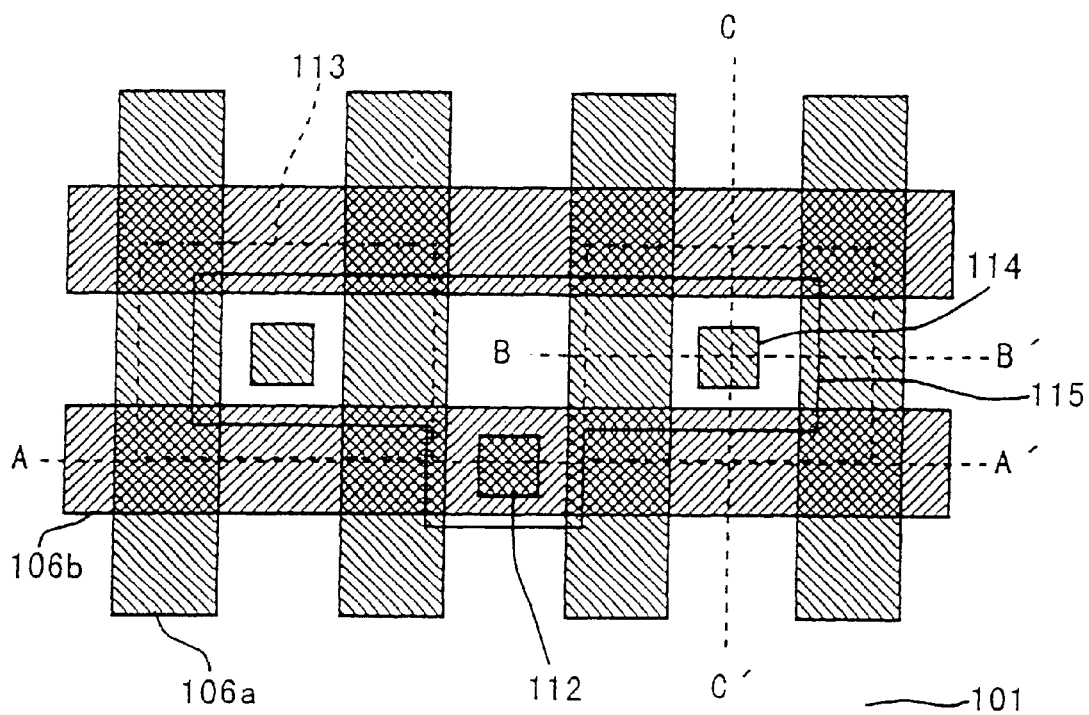
*PRIOR ART*
*FIG.21(a)*     *FIG.21(b)*     *FIG.21(c)*
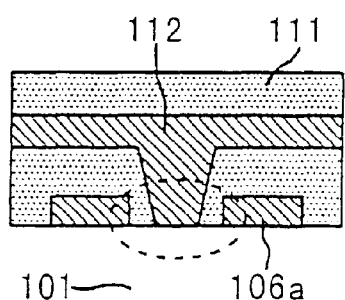 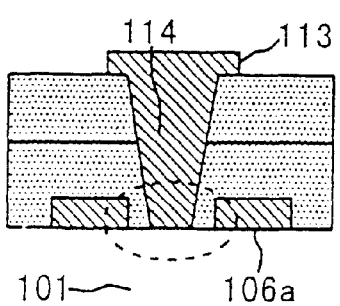 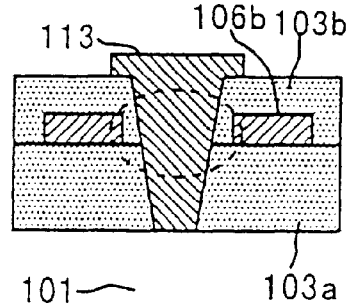

SEMICONDUCTOR DEVICE AND METHOD OF FABRICATING THE SAME

FIELD OF THE INVENTION

The present invention relates generally to a semiconductor device and a method of fabricating the same. More specifically, the present invention relates to a semiconductor device containing improved interlayer contacts and a method of fabricating the same.

BACKGROUND ART

FIG. 20 is a plan view of memory cells of a semiconductor DRAM. As shown in FIG. 20, the memory cells of the DRAM have word lines (transfer gate) 106a formed on a semiconductor wafer 101, and bit lines 106b formed above the word lines 106a. Therefore, a bit line contact 112 is disposed between the word lines 106a so as to extend near the word lines 106a down to the wafer 101.

A stacked capacitor is disposed above the bit line 106b. A contact 114 included in the capacitor, i.e., a storage node 113, is disposed in a space of a lattice of the word lines 106a and the bit lines 106b in an active region 115 so as to extend near the bit lines and the word lines down to the wafer 101.

FIGS. 21(a), 21(b) and 21(c) are sectional views of a contact in the DRAM, taken on line A–A', B–B' and C–C', respectively, in FIG. 20. As shown in FIGS. 21(a), 21(b) and 21(c) the word line 106a is formed on the semiconductor wafer 101, and the bit line 106b is disposed between a lower oxide film 103a and an upper oxide film 103b.

As techniques for forming minute lattices for semiconductor devices advance, the control of pattern superimposition and dimensional errors grows more difficult. For example, if patterns are not superimposed correctly, a bit line contact 112 or a storage node contact 113 can be accidentally connected to the word line 106a or the bit line 106b in a region enclosed by an ellipse indicated by a dotted line. Therefore, the contact must be formed in a smaller diameter or be formed by a self-aligning contact technique which forms a contact so that the contact may not accidentally be connected to a wiring line, even if the contact overlaps the wiring line.

FIGS. 22(a) to 22(c) illustrate, by way of example, self-alignment contact structures employing a nitride film. FIG. 22(a) illustrates a self-alignment contact structure of a blanket SiN system, using a silicon nitride film (SiN film) 108 formed between interlayer insulating oxide films 107 and 103. FIG. 22(b) illustrates a self-alignment contact structure of a SiN side wall system, using silicon nitride films 108 covering the side surfaces of a word line 106a. FIG. 22(c) illustrates a self-alignment contact structure of a SiN covered line system, using a silicon nitride film 108 covering the upper and side surfaces of a word line 106a. In these self-alignment contact structures, the word line (transfer gate) 106a is covered with the SiN film 108, i.e., an etching resistant film. In the self-alignment contact structure of a blanket SiN system, etching of the silicon dioxide film is temporarily stopped by the SiN film 108. The SiN film 108 and the underlying oxide film are then etched to form a hole reaching to the wafer 101. In the self-alignment contact structure of a SiN side wall system and the self-alignment contact structure of a SiN covered line system, oxide films are etched without also etching the SiN film 108 on the side surfaces, to form a hole reaching to the wafer 101.

The lateral size of the contacts of the foregoing DRAM has progressively been reduced, and the trend is towards the progressive reduction of the design diameter of holes. However, the Longitudinal thickness of the films has scarcely been reduced so that the parasitic capacity between the wiring lines will not increase. Therefore, the aspect ratio, i.e., the ratio of the depth of a contact hole to the diameter of the same, increases. In fine contact holes, there arises RIE lag, i.e., the reduction of etching rate at the bottom of a contact hole of a large aspect ratio. (Refer to, for example, J. Vac. Sci. Tech. B10(5), 1994)

FIGS. 23(a) and 23(b) are sectional views of contact holes for illustrating problems that may arise when forming a contact hole of a large aspect ratio. FIG. 23(a) shows an etching stop phenomenon, which occurred at the bottom of a contact hole of a large aspect ratio when forming the contact hole in a portion of an interlayer insulating film 103, corresponding to an opening formed in a resist film 110. Such an etching stop phenomenon can be avoided by enhancing an isotropic etching component. However, it is possible that the interlayer insulating film 103 is etched laterally as shown in FIG. 23(b), and a wiring line 106b, such as a bit line, formed within the interlayer insulating film 103, is exposed in the contact hole and is accidentally connected to a contact formed in the contact hole.

FIGS. 24(a) and 24(b) are views for illustrating problems that may arise in forming a contact between wiring lines in the self-alignment contact structure of a blanket SiN system. FIG. 24(a) illustrates an etching stop phenomenon which occurred in an opening formed in a gap in a SiN film 108. FIG. 24(b) illustrates the formation of a bottom portion of a large aspect ratio in a hole, when an opening is misaligned.

A self-alignment system using a silicon nitride film as an etching stopper film forms a nitride film, which is hard to etch, in the bottom of a deep contact hole liable to cause RIE lag, and the aspect ratio of the bottom portion of the contact hole narrowed by the nitride film is increased and is liable to cause incomplete etching. If faulty superimposition is made, the bottom portion of the contact hole is further narrowed toward the bottom and an unetched portion of the interlayer insulating film is liable to remain due to incomplete etching. Consequently, a defect due to no contact or contact of an increased resistance occurs owing to the incorrect contact hole.

A method of forming a silicon dioxide film as an interlayer insulating film without forming any steps in contact holes is disclosed in, for example, JP-A No. 1-274419. This prior art method, however, is not satisfactory in forming contact holes of a large aspect ratio.

SUMMARY OF THE INVENTION

The present invention has been made to solve those problems attributable to faulty contact holes and it is therefore an objective of the present invention to provide a semiconductor device having contacts formed in correct contact holes of a high aspect ratio and having large bottom contact surfaces, and a method of fabricating the same.

In one aspect of the present invention, a semiconductor device comprised of a semiconductor base layer and a multilayer interlayer insulating film is formed on the semiconductor base layer and consisting of a plurality of layers differing from each other in etching rate. A contact is formed in a hole which is in turn formed in the multilayer interlayer insulating film, the contact being in contact with the semiconductor base layer. Further, the diameter of the contact is increased in a portion thereof contiguous with the semiconductor base layer.

In another aspect of the present invention, in the semiconductor device, at least a conductive element is formed in one of the layers, having a relatively low etching rate among the layers of the interlayer insulating film, spaced at a predetermined distance apart from the semiconductor base layer and parallel to the semiconductor base layer. Further, the contact is formed at a position close to the conductive element.

In another aspect of the present invention, in the semiconductor device a plurality of the conductive elements are formed, and the contact is positioned between the adjacent pair of the plurality of conductive elements.

In another aspect of the present invention, in the semiconductor device the diameter of the contact is increased toward the semiconductor base layer in a portion contiguous with the semiconductor base layer.

In another aspect of the present invention, in the semiconductor device the diameter of the contact is increased stepwise toward the semiconductor base layer in a portion contiguous with the semiconductor base layer.

In another aspect of the present invention, in the semiconductor device the diameter of the contact is increased continuously toward the semiconductor base layer in a portion contiguous with the semiconductor base layer.

In another aspect of the present invention, in the semiconductor device a portion of the interlayer insulating film contiguous with the semiconductor base layer is formed having a high etching rate as compared with other portion of the interlayer insulating film. According to another aspect of the present invention, a semiconductor device comprises a semiconductor base layer. At least a lower conductive element is formed contiguous with the semiconductor base layer. An interlayer insulating film is formed on the semiconductor base layer so as to cover the lower conductive element. At least an upper conductive element is formed in the interlayer insulating film at a predetermined distance from the semiconductor base layer. Further, at least a contact is formed so as to be in contact with the semiconductor base layer in a hole formed in the interlayer insulating film at a position near the upper conductive element and the lower conductive element. Furthermore, the diameter of the contacts is increased between portions including the upper conductive element or the lower conductive element in the interlayer insulating film.

According to another aspect of the present invention, a semiconductor device comprises a semiconductor base layer. A plurality of conductive elements are formed on and contiguously with the semiconductor base layer. An etching resist film is formed covering at least side surfaces of the conductive elements, respectively. An interlayer insulating film, consisting of a plurality of layers differing in etching rate from each other, is formed on the semiconductor base layer so as to cover the etching resist films formed on the plurality of conductive elements. Further, at least a contact is formed in a hole formed in a portion of the interlayer insulating film between the adjacent etching resist films of the plurality of the conductive elements and extending through the adjacent etching resist film to the semiconductor base layer. Furthermore, a portion of the interlayer insulating film, contiguous with the semiconductor base layer and the etching resist film, is formed, having a high etching rate as compared with the other portion of the interlayer insulating film.

In another aspect of the present invention, in the semiconductor device, the plurality of conductive elements are covered with a silicon dioxide film.

In another aspect of the present invention, in the semiconductor device, the semiconductor base layer and the plurality of conductive elements are covered with a silicon dioxide film.

In another aspect of the present invention, in the semiconductor device, the diameter of each of the contacts is increased between the adjacent conductive elements toward the etching resist film covering the conductive element.

In another aspect of the present invention, in the semiconductor device, the diameter of the contact is increased between the adjacent conductive elements toward the silicon dioxide film covering the conductive elements. According to another aspect of the present invention, in a method of fabricating a semiconductor device, formed on a semiconductor base layer is an interlayer insulating film in which a portion nearer to the semiconductor base layer has relatively higher etching rate and a portion farther from the semiconductor base layer has relatively low etching rates, respectively. Then, at least a hole is formed through the interlayer insulating film so that the diameter of the hole increases toward the semiconductor base layer. Further, a contact is formed in the hole so as to be connected to the semiconductor base layer.

In another aspect of the present invention, in the semiconductor device fabricating method, in the step of forming the holes in the interlayer insulating film, formed is an etchinc resist film provided with at least an opening over the interlayer insulating film. Then, a hole is formed via the opening through the interlayer insulating film by anisotropic etching. Further, the diameter of a bottom portion of the hole is expanded by isotropic etching.

According to another aspect of the present invention, in a semiconductor device fabricating method, a plurality of conductive elements are formed on a semiconductor base layer, and at least the side surfaces of the conductive elements are covered with an etching resistant film, respectively. An interlayer insulating film is formed on the semiconductor base layer sa as to cover the etching resistant film. A portion contiguous with the semiconductor base layer and the etching resistant film has a relatively high etching rate, and a portion apart from the semiconductor base layer and the etching resistant film has a relatively low etching rate. Then, at least a hole is formed in the interlayer insulating film between the adjacent etching resist film of the plurality of conductive elements. Further, a contact is formed in the hole so as to be connected to the semiconductor base layer.

In another aspect of the present invention, in the semiconductor device fabricating method, a silicon dioxide film is formed over the plurality of conductive elements. In another aspect of the present invention, in the semiconductor device fabricating method, a silicon dioxide film is formed over the semiconductor base layer and the plurality of conductive elements.

In another aspect of the present invention, in the semiconductor device fabricating method, a portion of an interlayer insulating film having relatively higher etching rate is removed at the bottom of the hole by isotropic etching.

In another aspect of the present invention, in the semiconductor device fabricating method, a portion of the etching resistant film exposed in the hole, is removed by isotropic etching.

Other features and advantages of the present invention will become more apparent from the following description taken together with the accompanying drawings.

BRIEF DESCRIPTION OF THE DRAWINGS

FIG. 20 is a plan view of memory cells of a semiconductor DRAM.

FIGS. 21(a), 21(b) and 21(c) are sectional views of a contact in the DRAM, taken on line A–A', B–B' and C–C', respectively, in FIG. 20.

BEST MODE OF CARRYING OUT THE INVENTION

Figure 1:
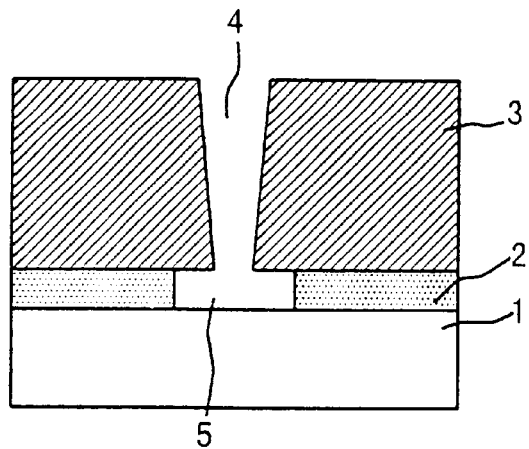
FIG. 1 is a sectional view of a semiconductor device in the first embodiment according to the present invention.

Preferred embodiments of the present invention will be described hereinafter with reference to the accompanying drawings, in which like or corresponding parts are designated by the same reference characters.

First Embodiment

FIG. 1 is a sectional view of a semiconductor device in a first embodiment according to the present invention. Shown in FIG. 1 are: a semiconductor wafer 1, such as a silicon wafer, as a semiconductor base layer; a lower silicon dioxide film 2 relatively heavily doped in a predetermined relatively high impurity concentration with boron (hereinafter referred to "B") or phosphorus (hereinafter referred to as "P"); and, an upper silicon dioxide film 3 relatively lightly doped in a predetermined relatively low impurity concentration with B or P. The upper silicon dioxide film 3 is either doped in the impurity concentration lower than that of the lower silicon dioxide film 2, or the same is not doped at all. The silicon dioxide films 2 and 3 constitute an interlayer insulating film; that: is, the silicon dioxide films 2 and 3 are the component layers of the interlayer insulating film.

Shown also in FIG. 1 is a contact hole 4 formed through the silicon dioxide films 2 and 3. The contact hole 4 has a bottom portion 5 formed in the lower silicon dioxide film 2. The diameter of the bottom portion 5 of the contact hole 4 is greater than that of a portion of the same formed in the upper silicon dioxide film 3. A conductive material is deposited in the contact hole 4 to form a contact.

Although contacts (conductive members) are not shown in the drawings used in the following description, it is to be assumed that contacts are to be formed in contact holes or contacts are formed in contact holes.

The relatively heavily doped lower silicon dioxide film 2 is etched at a high etching rate. Therefore, the lower silicon dioxide film 2, in which the bottom portion 5 of the contact hole 4 is formed, is etched satisfactorily and the bottom portion 5 of the contact hole 4 is not narrowed. The lower silicon dioxide film 2 is further etched to form the laterally expanded bottom portion 5, so that the contact hole 4 has a sectional shape resembling the inverted letter T.

In this embodiment, the interlayer insulating film in which the contact hole 4 is to be formed, has the lower silicon dioxide film 2 which is etched at a high etching rate so that the contact hole 4 of a large aspect ratio can correctly be formed and the bottom portion 5 of the contact hole 4 is expanded. Accordingly, a contact formed in the contact hole 4 has a bottom contact surface of an increased contact area and a reduced electrical resistance. Thus the contact hole 4 enables the formation of a contact of improved electrical characteristics.

A contact can be formed without being disconnected in the contact hole 4 by having an overhanging side wall, i.e., the contact hole 4 having the expanded bottom portion 5. The method will be described later.

Second Embodiment

Figure 2:
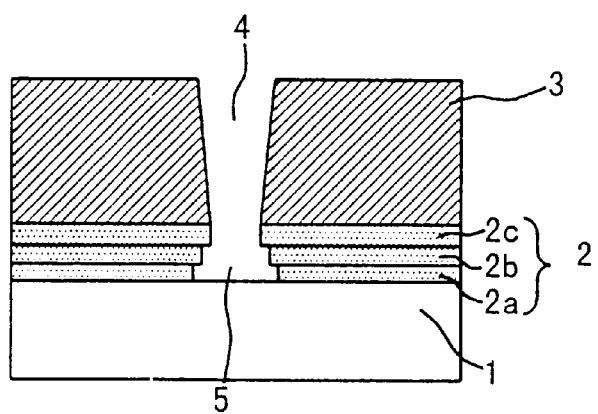
FIG. 2 is a sectional view of a semiconductor device in the second embodiment according to the present invention.

FIG. 2 is a sectional view of a semiconductor device in the second embodiment according to the present invention. Shown in FIG. 2 are a semiconductor wafer 1, such as a silicon wafer, a multilayer lower oxide film 2 consisting of a first lower silicon dioxide film 2a heavily doped with an impurity, such as B or P, a second lower silicon dioxide film 2b relatively heavily doped with an impurity, such as B or P, and a third lower silicon dioxide film 2c relatively heavily doped with an impurity, such as B or P, and an upper oxide film 3. The order of the lower silicon dioxide films 2a, 2b and 2c is the same as the decreasing order of the respective impurity concentrations of the lower silicon dioxide films 2a, 2b and 2c; that is, the impurity concentration of the first lower silicon dioxide film 2a is the highest, that of the second lower silicon dioxide film 2b is the second highest, and that of the third lower silicon dioxide film 2c is the lowest.

The upper oxide film 3 is relatively lightly doped with an impurity, such as B or P, or is not doped at all. When doped, the impurity concentration is lower than that of the third silicon diode thin film 2c. The lower oxide film 2 and the upper oxide film 3 constitute an interlayer insulating film. In FIG. 2, indicated at 4 is a contact hole formed through the oxide films 2 and 3, and indicated at 5 is a bottom portion of the contact hole 4, formed in the lower oxide film 2. The bottom portion 5 is expanded laterally and has a diameter greater than that of an upper portion of the contact hole 4, formed in the upper oxide film 3. The lower oxide film 2 is further etched to increase the diameter of the bottom portion 5 incrementally toward the bottom contiguous with the semiconductor wafer 1.

Since the lower silicon dioxide film 2 having a relatively large impurity concentration is etched at a high etching rate, the lower silicon dioxide film 2 can satisfactorily be etched and the bottom portion 5 of the contact hole 4 is not narrowed. The lower silicon dioxide film 2 is further etched to form the tapered bottom portion 5 by expanding a lower portion of the contact hole 4.

In this embodiment, the relatively heavily doped multilayer lower oxide film 2 consists of the lower silicon dioxide films 2a, 2b and 2b respectively, having the impurity concentrations of that order of magnitude, and the relatively lightly doped upper oxide film 3 has the impurity concentration lower than any one of those of the lower silicon dioxide films 2a, 2b and 2c, or is not doped at all.

Thus, the contact hole 4 of a large aspect ratio having the expanded bottom portion 5 can satisfactorily be formed. Accordingly, a contact formed in the contact hole 4 has a bottom contact surface of an increased contact area and a reduced electrical resistance. Thus the contact hole 4 enables the formation of a contact of improved electrical characteristics.

Third Embodiment

Figure 3:
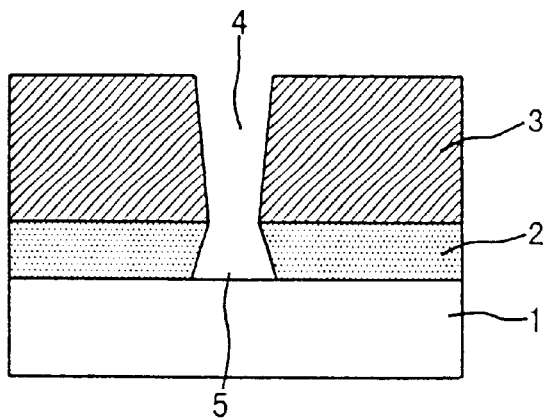
FIG. 3 is a sectional view of a semiconductor device in the third embodiment according to the present invention.

FIG. 3 is a sectional view of a semiconductor device in the third embodiment according to the present invention. Shown in FIG. 3 are a semiconductor wafer 1, such as a silicon wafer, and a lower silicon dioxide film 2 relatively heavily doped with an impurity, such as B or P. The impurity concentration distribution in the lower silicon dioxide film 2, with respect to its thickness, is a maximum in a portion contiguous with the semiconductor wafer 1 and decreases with distance from the semiconductor wafer 1.

Indicated at 3 is an upper silicon dioxide film relatively lightly doped with an impurity, such as B or P. The impurity concentration of the upper silicon dioxide film 3 is smaller than a minimum among the distributed impurity concentrations of the lower silicon dioxide film 2, or the upper silicon dioxide film 3 is not doped at all. The silicon dioxide films 2 and 3 constitute an interlayer insulating film. A contact hole 4 is formed through the silicon dioxide films 2 and 3, and has a tapered bottom portion 5 formed in the lower silicon dioxide film 2. The bottom portion 5 of the contact hole 4 is tapered upward, as viewed in FIG. 3.

Since the lower silicon dioxide film 2, having a relatively large impurity concentration, is etched at a high etching rate, the lower silicon dioxide film 2 can be satisfactorily etched and the bottom portion 5 of the contact hole 4 is not narrowed. The lower silicon dioxide film 2 is further etched to form the tapered bottom portion 5, by expanding a lower portion of the contact hole 4.

In this embodiment, the interlayer insulating film consists of the lower silicon dioxide film 2, doped so that the impurity concentration distribution is a maximum, in a portion of the lower silicon dioxide film 2, contiguous with the semiconductor wafer 1 and continuously decreasing with distance from the semiconductor wafer 1, and, the relatively thick upper silicon dioxide film 3 having the impurity concentration lower than the minimum impurity concentration of the lower silicon dioxide film 2, or not doped at all.

Therefore, the contact hole 4 of a large aspect ratio having the expanded bottom portion 5 can surely be formed. Accordingly, a contact formed by depositing a conductive material in the contact hole 4 has a bottom portion having an increased contact area, and has a reduced resistance and improved electrical characteristics.

Fourth Embodiment

Figure 4:
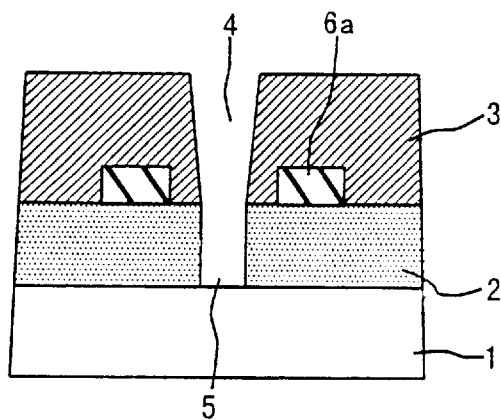
FIG. 4 is a sectional view of a semiconductor device in the fourth embodiment according to the present invention.

FIG. 4 is a sectional view of a semiconductor device in the fourth embodiment according to the present invention. Referring to FIG. 4, a lower oxide film 2 and an upper oxide film 3 constitute an interlayer insulating film. Conductive lines 6a, i.e., conductive elements, are formed on the lower oxide film 2 and covered with the upper oxide film 3. The fourth embodiment is similar to the first embodiment shown in FIG. 1 in other respects and hence the further description thereof will be omitted.

In this embodiment, the wiring lines 6a are buried in the interlayer insulating film. A contact hole 4 of a large aspect ratio is formed in a portion of the interlayer insulating film between the wiring lines 6a, and the lower oxide film 2 is etched at a high etching rate. Therefore, the contact hole 4 having an expanded bottom portion 5 can surely be formed. Accordingly, a contact formed by depositing a conductive material in the contact hole 4 has a bottom surface with an increased contact area, a reduced resistance and improved electrical characteristics.

Since the wiring lines 6a are buried in the upper oxide film 3, which is etched at a relatively low etching rate, the possibility of contact between the wiring lines 6a and the contact can be reduced.

Fifth Embodiment

Figure 5:
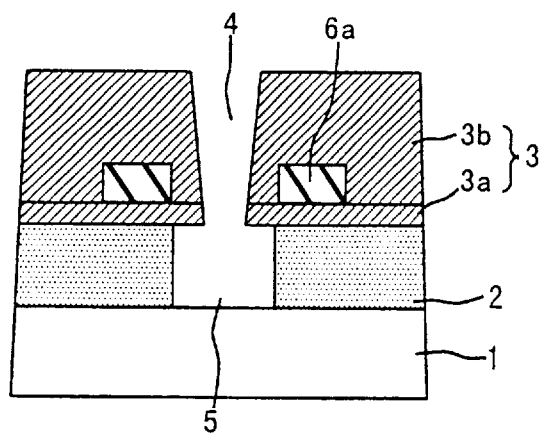
FIG. 5 is a sectional view of a semiconductor device in the fifth embodiment according to the present invention.

FIG. 5 is a sectional view of a semiconductor device in the fifth embodiment according to the present invention. Shown in FIG. 5 are a lower silicon dioxide film 2, an upper silicon dioxide film 3 consisting of a silicon dioxide film 3a formed on the lower silicon dioxide film 2, and a silicon dioxide film 3b formed on the silicon dioxide film 3a so as to cover wiring lines 6a, i.e., conductive elements, formed on the silicon dioxide film 3a. The silicon dioxide films 3a and 3b have the same impurity concentration. The wiring lines 6a are buried in the upper silicon dioxide film 3. The fifth embodiment is similar to the fourth embodiment shown in FIG. 4 in other respects, and hence the further description thereof will be omitted.

In this embodiment, since the wiring lines 6a are buried in the upper silicon dioxide film 3, which is etched at a low etching rate, the accidental connection of the wiring lines 6a with a contact formed in a contact hole 4, formed through the silicon dioxide films 2 and 3, can be prevented. Other effects of the fifth embodiment are the same as those of the fourth embodiment (FIG. 4) and hence the description thereof will be omitted to avoid duplication.

Sixth Embodiment

Figure 6:
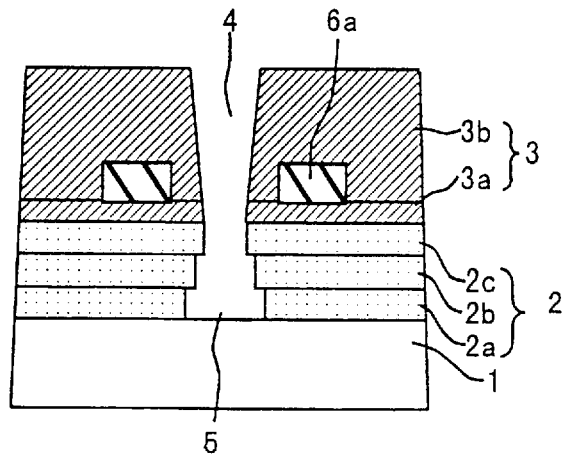
FIG. 6 is a sectional view of a semiconductor device in the sixth embodiment according to the present invention.

FIG. 6 is a sectional view of a semiconductor device in the sixth embodiment according to the present invention. Referring to FIG. 6, a lower silicon dioxide film 2 of a multilayer construction consists of a first lower silicon dioxide film 2a, a second lower silicon dioxide film 2b, and a third lower silicon dioxide film 2c. The construction and properties of the lower oxide film 2 are the same as those of the lower oxide film 2 of the second embodiment shown in FIG. 2 and hence the description thereof will be omitted. The sixth embodiment is similar to the fifth embodiment shown in FIG. 5 in other respects and hence the further description thereof will be omitted.

In this embodiment, since wiring lines 6a are buried in an upper silicon dioxide film 3, which is etched at a low etching rate, the accidental connection of the wiring lines 6a with a contact formed in a contact hole 4 formed through the silicon dioxide films 2 and 3, can be prevented.

Since the diameter of the bottom portion 5 is increased stepwise toward the bottom, contiguous with a semiconductor wafer 1, such as a silicon wafer, a contact formed by depositing a conductive material in the contact hole 4, similarly to the contact of the second embodiment, has a reduced resistance. The sixth embodiment is the same in other respects as the second and the fifth embodiment in other respects and hence the further description thereof will be omitted to avoid duplication.

Seventh Embodiment

Figure 7:
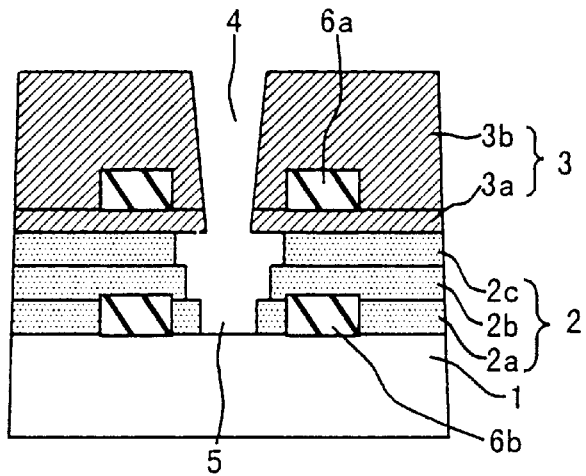
FIG. 7 is a sectional view of a semiconductor device in the seventh embodiment according to the present invention.

FIG. 7 is a sectional view of a semiconductor device in the seventh embodiment according to the present invention. Referring to FIG. 7, lower wiring lines 6b, i.e., lower conductive elements, are formed on a semiconductor wafer 1, and a multilayer lower silicon dioxide film 2, consisting of: a first lower silicon dioxide film 2a, a second lower silicon dioxide film 2b, and a third lower silicon dioxide film 2c, which is formed on the semiconductor wafer 1 so as to cover the lower wiring lines 6b. The third lower silicon dioxide film 2c is doped in the largest impurity concentration with an impurity, such as B or P, the second lower silicon dioxide film 2b is doped in an impurity concentration lower than that of the third lower silicon dioxide film 2c, and the first lower silicon dioxide film 2a is doped in an impurity concentration lower than that of the second lower silicon dioxide film 2b; that is, the impurity concentration of the third lower silicon dioxide film 2c is the highest, that of the second lower silicon dioxide film 2b is the second highest and that of the first lower silicon dioxide film 2a is the lowest. A contact hole 4 has a bottom portion 5 formed in the lower oxide film 2. A section of the bottom portion 5 of the contact hole 4, formed in the first lower silicon dioxide film 2a including the lower wiring lines 6b is substantially not expanded, and sections of the bottom portion 5, formed in the second lower silicon dioxide film 2b and the third lower silicon dioxide film 2c between the lower wiring lines 6b and upper wiring lines 6a are expanded. The seventh embodiment is similar to the sixth embodiment shown in FIG. 6 in other respects and hence further description thereof will be omitted.

In this embodiment, the lower silicon dioxide film 2 is etched at an etching rate higher than that at which the upper oxide film 3 is etched. The lower silicon dioxide film 2 is a multilayer film formed on the semiconductor wafer 1 on which the lower wiring lines 6b are formed and consists of the component lower silicon dioxide films 2a, 2b and 2c which are etched at different etching rates, respectively. The etching rate of the first lower silicon dioxide film 2a is the lowest, the etching rate of the second lower silicon dioxide film 2b is the second lowest and the etching rate of the third lower silicon dioxide film 2c is the highest. Accordingly, the diameter of the bottom portion 5 of the contact hole 4, below the upper wiring lines 6a increases incrementally from the bottom upward. Since the first lower silicon dioxide film 2a, in which the lower wiring lines 6b are formed and the bottom section of the bottom portion 5 of the contact hole 4 is formed, is etched at the relatively low etching rate, the accidental connection of the lower wiring lines 6b and a contact formed by depositing a conductive material in the contact hole 4 can be prevented. Since the sectional area of a portion of the contact corresponding to a portion of the interlayer insulating film between the upper wiring lines 6a and the lower wiring lines 6b is increased, the resistance of the contact is reduced accordingly.

Eighth Embodiment

Figure 8:
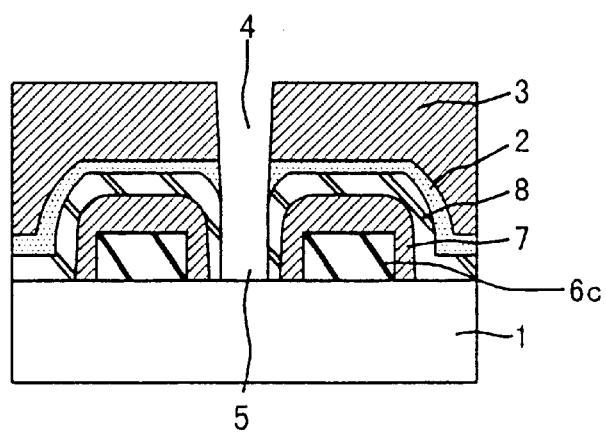
FIG. 8 is a sectional view of a semiconductor device in the eighth embodiment according to the present invention.

FIG. 8 is a sectional view of a semiconductor device in the eighth embodiment according to the present invention. Shown in FIG. 8 are: a semiconductor wafer 1, such as a silicon wafer, wiring lines 6c, i.e., conductive elements, formed on the semiconductor wafer 1, silicon dioxide films 7 covering the wiring lines 6c, an etching stopper film 8 of silicon nitride (SiN) covering the silicon dioxide films 7, a lower silicon dioxide film 2 formed on the etching stopper film 8, and an upper silicon dioxide film 3 formed on the lower silicon dioxide film 2. The lower silicon dioxide film 2 and the upper silicon dioxide film 3 constitute an interlayer insulating film. Indicated at 4 is a contact hole and at 5 is a bottom portion of the contact hole 4.

This semiconductor device is a self-alignment contact structure consisting of a blanket system employing the etching stopper film 8 of SiN formed over the wiring lines 6c. An interlayer insulating film, consisting of multilayer of the lower silicon dioxide film 2, and the upper silicon dioxide film 3, is formed over the SiN etching stopper films 8. The lower silicon dioxide film 2 contiguous with the SiN etching stopper film 8 has a relatively high etching rate. The contact hole 4 is formed in a region between portions of the SiN etching stopper film 8 covering the adjacent wiring lines 6c.

Since the lower silicon dioxide film 2 has a high etching rate corresponding to a bottom portion 5 of the contact hole 4, narrowed by the SiN etching stopper film 8, no etching stop phenomenon occurs even if the aspect ratio of the contact hole 4 is increased locally. The interlayer insulating film can easily be etched to the SiN etching film 8. The SiN etching stopper film 8 is etched by anisotropic etching so that the SiN etching stopper film 8 may not be excessively etched to expose the oxide films 7 covering the wiring lines 6c, to prevent the accidental connection of a contact formed by depositing a conductive material in the contact hole 4 with the wiring lines 6c.

Since the narrow region between the portions of the etching stopper film 8 is filled with the lower silicon dioxide film 2 having a high etching rate, no etching stop phenomenon occurs when forming the contact hole 4 in the narrow region and the contact hole 4 of a high aspect ratio can surely be formed.

The construction of this embodiment is particularly effective when covering the plurality of lower wiring lines 6c with the SiN etching stopper film 8 and forming contact holes in regions between adjacent portions of the adjacent SiN etching stopper film 8.

Ninth Embodiment

Figure 9:
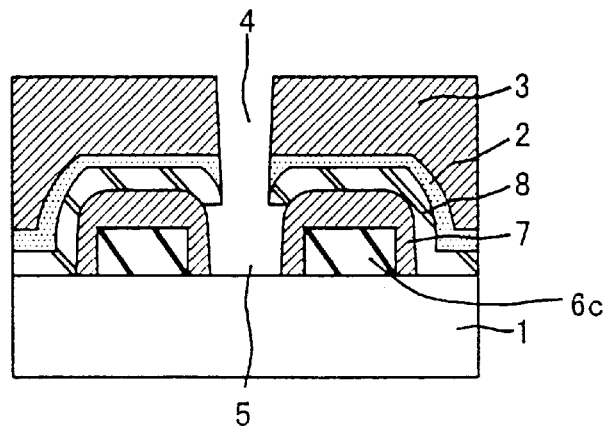
FIG. 9 is a sectional view of a semiconductor device in the ninth embodiment according to the present invention.

FIG. 9 is a sectional view of a semiconductor device in the ninth embodiment according to the present invention. As shown in FIG. 9, a portion of SiN etching stopper film 8 corresponding to a bottom portion 5 of a contact hole 4 is removed by isotropic etching to form the bottom portion 5 in an expanded shape. The ninth embodiment is similar to the eighth embodiment shown in FIG. 8 in other respects and hence the further description thereof will be omitted.

The structure of the semiconductor device in the ninth embodiment is formed by removing the portion of the SiN etching stopper film 8, corresponding to the bottom portion 5 of the contact hole 4 of the structure of the semiconductor device in the eighth embodiment, by further isotropic etching. Therefore, the area of the bottom portion 5 of the contact hole 4 is increased by a value corresponding to the removed portion of the SiN etching stopper film 8, and a contact formed by depositing a conductive material in the contact hole 4 has a reduced resistance and improved electric characteristics.

Tenth Embodiment

Figure 10:
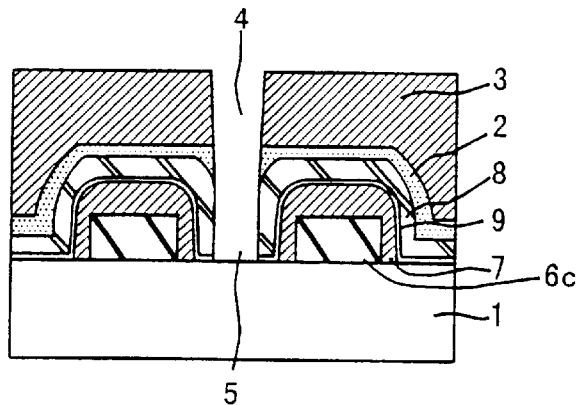
FIG. 10 is a sectional view of a semiconductor device in the tenth embodiment according to the present invention.

FIG. 10 is a sectional view of a semiconductor device in the tenth embodiment according to the present invention. Shown in FIG. 10 are a semiconductor wafer 1, lower wiring lines 6c formed on the semiconductor wafer 1, silicon dioxide films 7 covering the lower wiring lines 6c, a thin silicon dioxide film 9 covering the silicon dioxide films 7, and portions of the surface of the semiconductor wafer 1 exposed between the adjacent lower wiring lines 6c, and a SiN etching stopper film 8 covering the silicon dioxide film 9. The tenth embodiment is similar to the eighth embodiment shown in FIG. 8 in other respects and hence the further description thereof will be omitted.

The tenth embodiment differs from the eighth embodiment in that the tenth embodiment is provided with the thin silicon dioxide film 9 underlying the SiN etching stopper film 8.

When forming a contact hole 4, a portion of the SiN etching stopper film 8 is removed by anisotropic etching under the condition not to etch the thin silicon dioxide film 9, so that the thin silicon dioxide film 9 remains unremoved, and then the thin silicon dioxide film 9 is removed by highly selective etching. Therefore, the semiconductor wafer 1 is not etched when forming the contact hole 4 and a contact with stable contact characteristics can be formed.

Other effects of the tenth embodiment are the same as those of the eighth embodiment shown in FIG. 8 and hence the description thereof will be omitted.

Eleventh Embodiment

Figure 11:
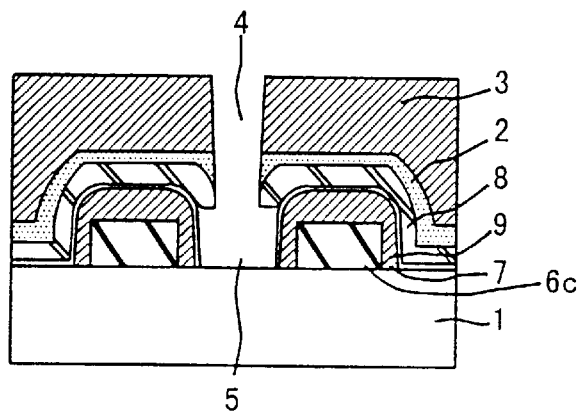
FIG. 11 is a sectional view of a semiconductor device in the eleventh embodiment according to the present invention.

FIG. 11 is a sectional view of a semiconductor device in the eleventh embodiment according to the present invention. As shown in FIG. 11, a portion of a SiN etching stopper film 8, corresponding to a bottom portion 5 of a contact hole 4, is removed to expand the bottom portion 5 diametrically. The eleventh embodiment is similar to the tenth embodiment shown in FIG. 10 in other respects and hence the further description thereof will be omitted.

The structure of the semiconductor device in the eleventh embodiment is formed by removing a portion of the SiN etching stopper film 8, corresponding to the bottom portion 5 of the contact hole 4 of the structure of the semiconductor device in the tenth embodiment, by additional isotropic etching to expand the bottom portion 5 laterally.

As viewed in a different light, the eleventh embodiment is formed by forming a thin silicon dioxide film 9, so as to underlie the SiN etching stopper film 8 of the ninth embodiment shown in FIG. 9.

The eleventh embodiment is similar to the tenth embodiment in that it can be formed without etching the semiconductor wafer 1 and is able to secure a stable contact characteristic.

In the eleventh embodiment, the area of the bottom portion 5 of the contact hole 4 is increased by a value corresponding to the removed portion of the SiN etching stopper film 8. A contact formed by depositing a conductive material in the contact hole 4 has an increased sectional area, a reduced resistance and improved electric characteristics.

The effects of the eleventh embodiment are the same as those of the ninth and the tenth embodiment and hence the description thereof will be omitted.

Twelfth Embodiment

Figure 12:
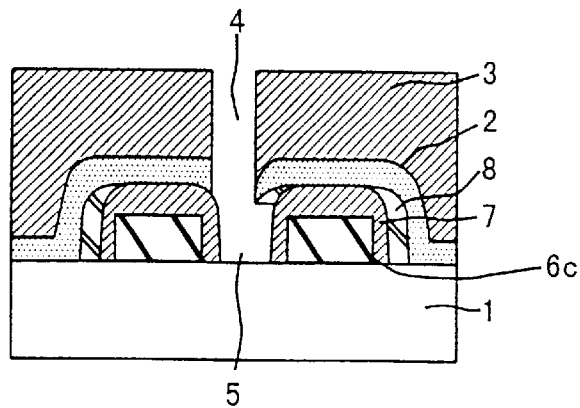
FIG. 12 is a sectional view of a semiconductor device in the twelfth embodiment according to the present invention.

FIG. 12 is a sectional view of a semiconductor device in the twelfth embodiment according to the present invention. Whereas the SiN etching stopper film 8 of the ninth embodiment shown in FIG. 9 covers the silicon dioxide films 7 entirely, a SiN etching stopper film 8 in the twelfth embodiment covers only the side surfaces of silicon dioxide films 7 as shown in FIG. 12; that is, the semiconductor device in the twelfth embodiment is a self-alignment contact structure employing the SiN etching stopper film 8 formed only over the side surfaces of lower wiring lines 6c.

In this embodiment, a portion of the SiN etching stopper film 8, corresponding to a bottom portion 5 of a contact hole 4, is removed and thereby the bottom portion 5 is diametrically expanded. The twelfth embodiment is similar to the ninth embodiment shown in FIG. 9 in other respects and hence the further description thereof will be omitted.

Thus, a contact formed by depositing a conductive material in the contact hole 4 has a portion formed in the expanded bottom portion 5 and has a sectional area increased by a value corresponding to the thickness of the removed portion of the SiN etching stopper film 8. Therefore, the contact has a reduced resistance and improved electrical characteristics. Other effects of the twelfth embodiment are the same as those of the ninth embodiment shown in FIG. 9 and hence the description thereof will be omitted.

Thirteenth Embodiment

Figure 13:
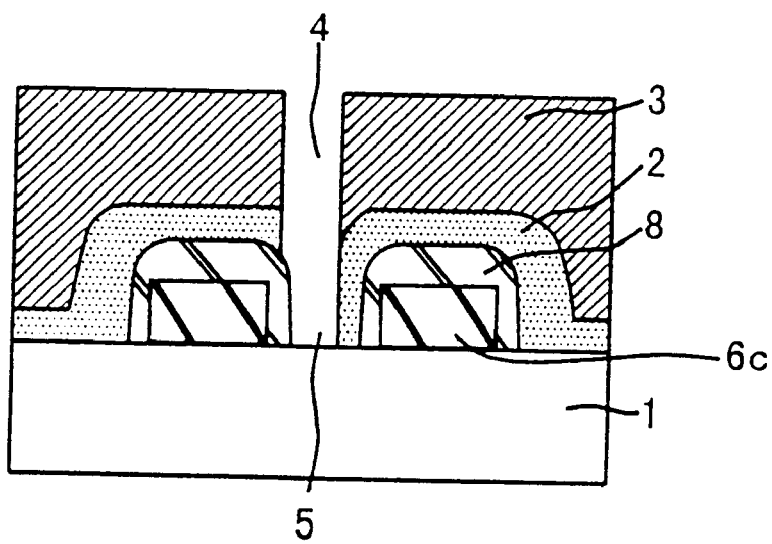
FIG. 13 is a sectional view of a semiconductor device in the thirteenth embodiment according to the present invention.

FIG. 13 is a sectional view of a semiconductor device in the thirteenth embodiment according to the present invention. In this embodiment, a SiN etching stopper film 8 is formed directly over lower wiring lines 6c, as shown in FIG. 13, instead of forming the SiN etching stopper film 8 over the silicon dioxide film 7, covering the lower wiring lines 6c in the eighth embodiment shown in FIG. 8. The semiconductor device in the thirteenth embodiment is a self-alignment contact structure employing a SiN etching stopper film 8 directly covering the lower wiring lines 6c.

As shown in FIG. 13, a portion of a lower silicon dioxide film 2, corresponding to a bottom portion 5 of a contact hole 4, is removed, and the SiN etching stopper film 8 is not etched at all. The thirteenth embodiment is similar to the eighth embodiment shown in FIG. 8 in other respects and hence the further description thereof will be omitted.

The contact hole 4 can be formed in a narrow region between adjacent portions of the SiN etching stopper film 8 without causing an etching stop phenomenon, i.e., a contact of a large aspect ratio can surely be formed, because the narrow region is filled with the lower silicon dioxide film 2, which has a high etching rate.

The SiN etching stopper film 8 prevents the accidental connection of the lower wiring lines 6c with the contact. Other effects of the thirteenth embodiment are the same as those of the eighth embodiment and hence the description thereof will be omitted.

Fourteenth Embodiment

Figure 14:
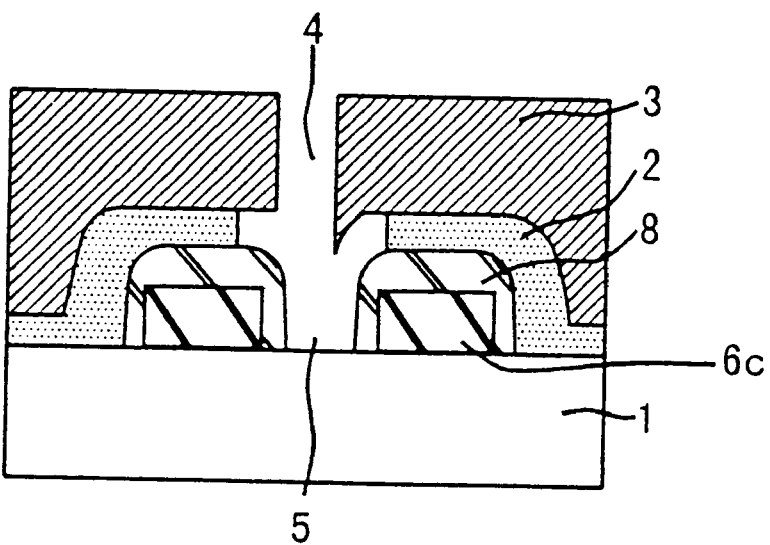
FIG. 14 is a sectional view of a semiconductor device in the fourteenth embodiment according to the present invention.

FIG. 14 is a sectional view of a semiconductor device in the fourteenth embodiment according to the present invention. A semiconductor device in the fourteenth embodiment, similarly to that in the thirteenth embodiment, is a self-alignment contact structure employing the SiN etching stopper film 8 to directly cover the lower wiring lines 6c.

As shown in FIG. 14, a portion of a lower silicon dioxide film 2 corresponding to a section of a bottom portion 5 of a contact hole 4 is etched laterally to expand the section of the bottom portion 5 diametrically. The fourteenth embodiment is similar to the thirteenth embodiment shown in FIG. 13 and hence the further description thereof will be omitted.

The structure in the fourteenth embodiment is obtained by further removing a portion of the lower silicon dioxide film 2, in the bottom portion 5 of the contact hole 4 of the structure in the thirteenth embodiment, by isotropic etching to expand the bottom portion 5 laterally. The sectional area of a portion of a contact, formed by depositing a conductive material in the contact hole 4, corresponding to the removed portion of the lower silicon dioxide film 2, is increased by a value corresponding to the thickness of the removed portion of the lower silicon dioxide film 2, and the contact has a reduced resistance and improved electrical characteristics.

Other effects of the fourteenth embodiment are the same as those of the thirteenth embodiment and hence the description thereof will be omitted.

Fifteenth Embodiment

FIGS. 15(a) to 15(d) are sectional views illustrating steps of a semiconductor device fabricating method in the fifteenth embodiment according to the present invention. The semiconductor device fabricating method in the fifteenth embodiment will be described hereinafter with reference to FIGS. 15(a) to 15(d).

Figure 15:
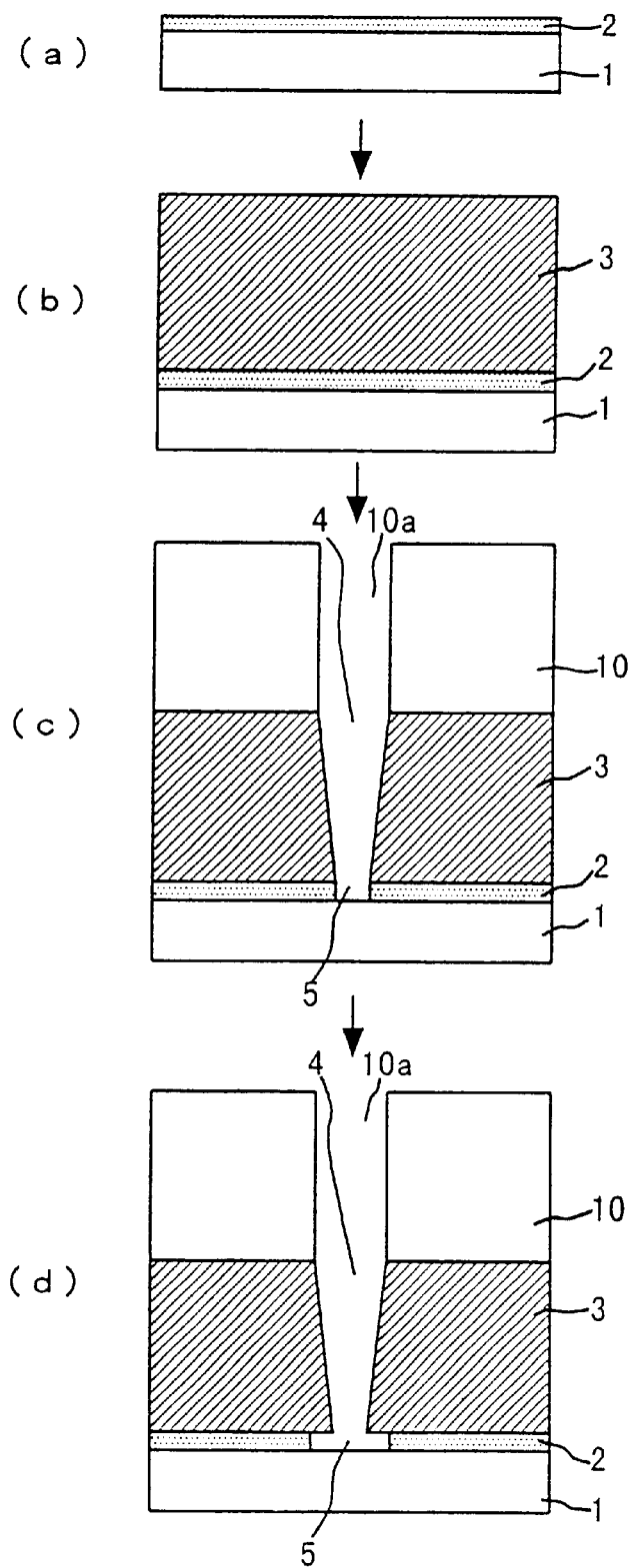
FIGS. 15(a) to 15(d) are sectional views illustrating steps of a semiconductor device fabricating method in the fifteenth embodiment according to the present invention.

As shown in FIG. 15(a), a lower silicon dioxide film 2, relatively heavily doped with an impurity, such as B or P, is formed on a semiconductor wafer 1, such as a silicon wafer. Then, as shown in FIG. 15(b), an upper silicon dioxide film 3 relatively lightly doped with an impurity, such as B or P, is formed over the lower silicon dioxide film 2. The upper silicon dioxide film 3 is doped in a impurity concentration lower than that of the lower silicon dioxide film 2, or the upper silicon dioxide film 3 is not doped at all. The silicon dioxide films 2 and 3 constitute an interlayer insulating film.

Then, as shown in FIG. 15(c), the surface of the upper silicon dioxide film 3 is coated with a resistant film 10, an opening 10a is formed in the resistant film 10, and portions of the silicon dioxide film 3 and 2 corresponding to the opening 10a, are removed by anisotropic etching to form a contact hole 4 having a bottom portion 5.

Since the relatively heavily doped lower silicon dioxide film 2 is etched at a high etching rate, the lower silicon dioxide film 2 can satisfactorily be etched to form the contact hole 4.

Then, as shown in FIG. 15(d), the side surface of the contact hole 4 is etched by isotropic etching using an etchant which etches silicon dioxide films having different impurity concentrations at different etching rates, respectively, such as hydrofluoric acid. Since the lower silicon dioxide film 2 is etched at a high etching rate, the lower silicon dioxide film 2 is etched more rapidly than the upper silicon dioxide film 3, and hence a bottom portion 5 of the contact hole 4, corresponding to the lower silicon dioxide film 2, is laterally expanded.

Subsequently, a contact is formed in the contact hole 4.

A method of forming the contact in the contact hole 4, having an overhanging circumference without forming any disconnection in the contact, will be described hereinafter.

A method disclosed in IEDM (International Electron Device Meeting) 1988, pp. 592–595 is one of the possible methods. This method deposits polysilicon or a metal, such as Ti or W, in the contact hole 4 by a CVD process. The CVD process is capable of depositing a film in minute gaps of, for example, about 0.05 m in width. When the contact is formed in the contact hole 4 by the CVD process, a void may be formed in the expanded bottom portion 5 of the contact hole, but any disconnection is not formed.

Another possible method is that disclosed in IEDM 1996, pp. 665–668. This method employs an anisotropic selective epitaxial silicon growth process, which forms a silicon film only on an exposed portion of the surface of the silicon wafer, i.e., a contact portion of the silicon wafer. This method is able to deposit a voidless film in the contact hole 4 to form a contact.

As described above, the semiconductor device in the first embodiment shown in FIG. 1 is fabricated.

When forming the contact hole 4, a lower portion of the interlayer insulating film corresponding to the bottom portion 5 of the contact hole 4, in which RIE lag is liable to occur, can properly be etched, and any etching stop phenomenon does not occur because the lower portion of the interlayer insulating film corresponding to the bottom portion 5 of the contact hole is in the lower silicon dioxide film 2 which is etched at a high etching rate.

Accordingly, the contact hole 4 of a large aspect ratio can surely be formed, and the yield of the contact hole forming process is improved. A contact having a bottom surface with an increased contact area, a reduced resistance and improved electrical characteristics can be formed in the contact hole 4.

Sixteenth Embodiment

FIGS. 16(a) to 16(f) are sectional views illustrating steps of a semiconductor device fabricating method in the sixteenth embodiment according to the present invention. The semiconductor device fabricating method in the sixteenth embodiment will be described hereinafter with reference to FIGS. 16(a) to 16(f).

As shown in FIG. 16(a), a lower silicon dioxide film 2a doped with an impurity, such as B or P, is formed on a semiconductor wafer 1, such as a silicon wafer. Then, as shown in FIG. 16(b), a second lower silicon dioxide film 2b doped with an impurity, such as B or P, is formed on the first lower silicon dioxide film 2a. The impurity concentration of the first lower silicon dioxide film 2a is greater than that of the second lower silicon dioxide film 2b.

Then, as shown in FIG. 16(c), a third lower silicon dioxide film 2c doped with an impurity, such as B or P, is formed on the second lower silicon dioxide film 2b. The impurity concentration of the third lower silicon dioxide film 2c is smaller than that of the second lower silicon dioxide film 2b. That is, the impurity concentration of the first lower silicon dioxide film 2a is the highest:, that of the second lower silicon dioxide film 2b is the second highest and that of the third lower silicon dioxide film 2c is the smallest. The first lower silicon dioxide film 2a, the second lower silicon dioxide film 2b and the third lower silicon dioxide film 2c constitute a multilayer lower silicon dioxide film 2.

Then, as shown in FIG. 16(d), an upper silicon dioxide film 3, relatively lightly doped with an impurity, such as B ox P, is formed over the third lower silicon dioxide film 2c. The upper silicon dioxide film 3 is doped in a impurity concentration lower than that of the third lower silicon dioxide film 2c, or the upper silicon dioxide film 3 is not doped at all. The silicon dioxide films 2 and 3 constitute an interlayer insulating film.

Then, as shown in FIG. 16(e), the surface of the upper silicon dioxide film 3 is coated with a resistant film 10, an opening 10a is formed in the resistant film 10, and portions of the silicon dioxide film 3 and 2 corresponding to the opening 10a are removed by anisotropic etching to form a contact hole 4 having a bottom portion 5.

Since the lower silicon dioxide film 2, corresponding to the bottom portion 5 of the contact hole 4, consists of the component lower silicon dioxide films 2a, 2b and 2c, all having relatively large impurity concentrations and high etching rates, the bottom portion 5 can be formed in a satisfactory shape.

Then, as shown in FIG. 16(f), the side surface of the contact hole 4 is etched by isotropic etching using an etchant which etches silicon dioxide films having different impurity concentrations at different etching rates, respectively, such as hydrofluoric acid. Since the lower silicon dioxide film 2 is etched at a high etching rate, the lower silicon dioxide film 2 is etched more rapidly than the upper silicon dioxide film 3 and hence a bottom portion 5 of the contact hole 4, corresponding to the lower silicon dioxide film 2, is laterally expanded and the diameter of the bottom portion 5 is increased incrementally toward the bottom.

Subsequently, a contact is formed in the contact hole 4. Thus, the semiconductor device in the second embodiment previously described with reference to FIG. 2 is fabricated.

The lower silicon dioxide film 2 of the interlayer insulating film, in which the contact hole 4 is formed, consists of the lower silicon dioxide films 2a, 2b and 2c laminated in that order in a decreasing order of impurity concentration. The thicker upper silicon dioxide film 3 has an impurity concentration lower than that of the third lower silicon dioxide film 2c, which is the lowest concentration among those of the lower silicon dioxide films 2a, 2b and 2c, or the upper silicon dioxide film 3 is not doped at all. When forming the contact hole 4, a lower portion of the interlayer insulating film corresponding to the bottom portion 5 of the contact hole 4, in which RIE lag is liable to occur, can properly be etched and any etching stop phenomenon does not occur, because the lower portion of the interlayer insulating film corresponding to the bottom portion 5 of the contact hole 4 is etched at a higher etching rate.

Accordingly, the contact hole 4 of a large aspect ratio can surely be formed and the yield of the contact hole forming process can be improved. A contact having a bottom surface of an increased contact area, a reduced resistance and improved electrical characteristics can be formed in the contact hole 4.

Seventeenth Embodiment

Figure 17:
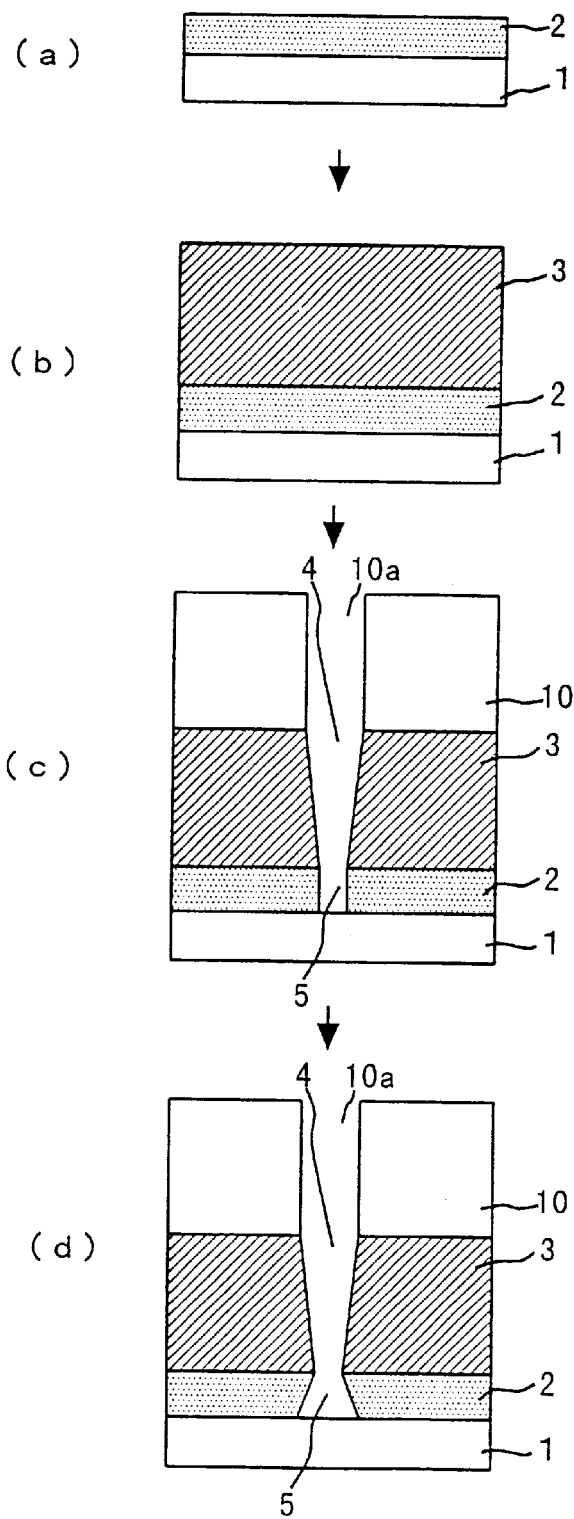
FIGS. 17(a) to 17(d) are sectional views illustrating steps of a semiconductor device fabricating method in the seventeenth embodiment according to the present invention.

FIGS. 17(*a*) to 17(*d*) are sectional views illustrating steps of a semiconductor device fabricating method in the seventeenth embodiment according to the present invention. The semiconductor device fabricating method in the seventeenth embodiment will be described hereinafter with reference to FIGS. 17(*a*) to 17(*d*).

As shown in FIG. 17(*a*), a lower silicon dioxide film 2 doped with an impurity, such as B or P, is formed on a semiconductor wafer 1, such as a silicon wafer. The lower silicon dioxide film 2 is doped so that its impurity concentration decreases continuously with distance from the semiconductor wafer 1.

Then, as shown in FIG. 17(*b*), an upper silicon dioxide film 3 relatively lightly doped with an impurity, such as B or P, is formed over the lower silicon dioxide film 2. The upper silicon dioxide film 3 is doped in a impurity concentration lower than that of the lower silicon dioxide film 2, or the upper silicon dioxide film 3 is not doped at all. The silicon dioxide films 2 and 3 constitute an interlayer insulating film.

Then, as shown in FIG. 17(*c*), the surface of the upper silicon dioxide film 3 is coated with a resistant film 10, an opening 10a is formed in the resistant film 10, and portions of the silicon dioxide film 3 and 2 corresponding to the opening 10a are removed by anisotropic etching to form a contact hole 4 having a bottom portion 5.

Since the relatively heavily doped lower silicon dioxide film 2 is etched at a high etching rate, the lower silicon dioxide film 2 can be satisfactorily etched to form the contact hole 4, having a satisfactorily etched bottom portion 5.

Then, as shown in FIG. 17(*d*), the side surface of the contact hole 4 is etched by isotropic etching using an etchant which etches silicon dioxide films having different impurity concentrations at different etching rates, respectively, such as hydrofluoric acid. Since the lower silicon dioxide film 2 is etched at a high etching rate, the lower silicon dioxide film 2 is etched more rapidly than the upper silicon dioxide film 3, and hence, a bottom portion 5 of the contact hole 4, corresponding to the lower silicon dioxide film 2, is laterally expanded. Since the lower silicon dioxide film 2 has an impurity concentration continuously increasing toward its lower surface, the portions of the lower silicon dioxide film 2 nearer to the semiconductor wafer 1 are more greatly expanded laterally, so that the bottom portion 5 is formed in an upward tapered shape.

Subsequently, a contact is formed in the contact hole 4.

Thus, the semiconductor device in the third embodiment previously described with reference to FIG. 3 is fabricated.

This semiconductor device fabricating method deposits the lower silicon dioxide film 2, and forms the bottom layer of the interlayer insulating film in which the contact hole 4 is formed, and having the impurity concentration continuously decreasing toward its upper surface. Therefore, portions of the interlayer insulating film nearer to the bottom are etched at higher etching rates. Since the lower silicon dioxide film 2 corresponding to the bottom portion 5, in which RIE lag is liable to occur, if the contact hole 4 is etched at an etching rate higher than that of the upper silicon dioxide film 3, a portion of the lower silicon dioxide film 2 corresponding to the bottom portion 5 is etched satisfactorily and hence any etching stop phenomenon does not occur.

Accordingly, the contact hole 4 of a large aspect ratio can surely be formed and the yield of the contact hole forming process can be improved. A contact having a bottom surface of an increased contact area, a reduced resistance and improved (electrical characteristics can be formed in the contact hole 4.

Eighteenth Embodiment

Figure 18:
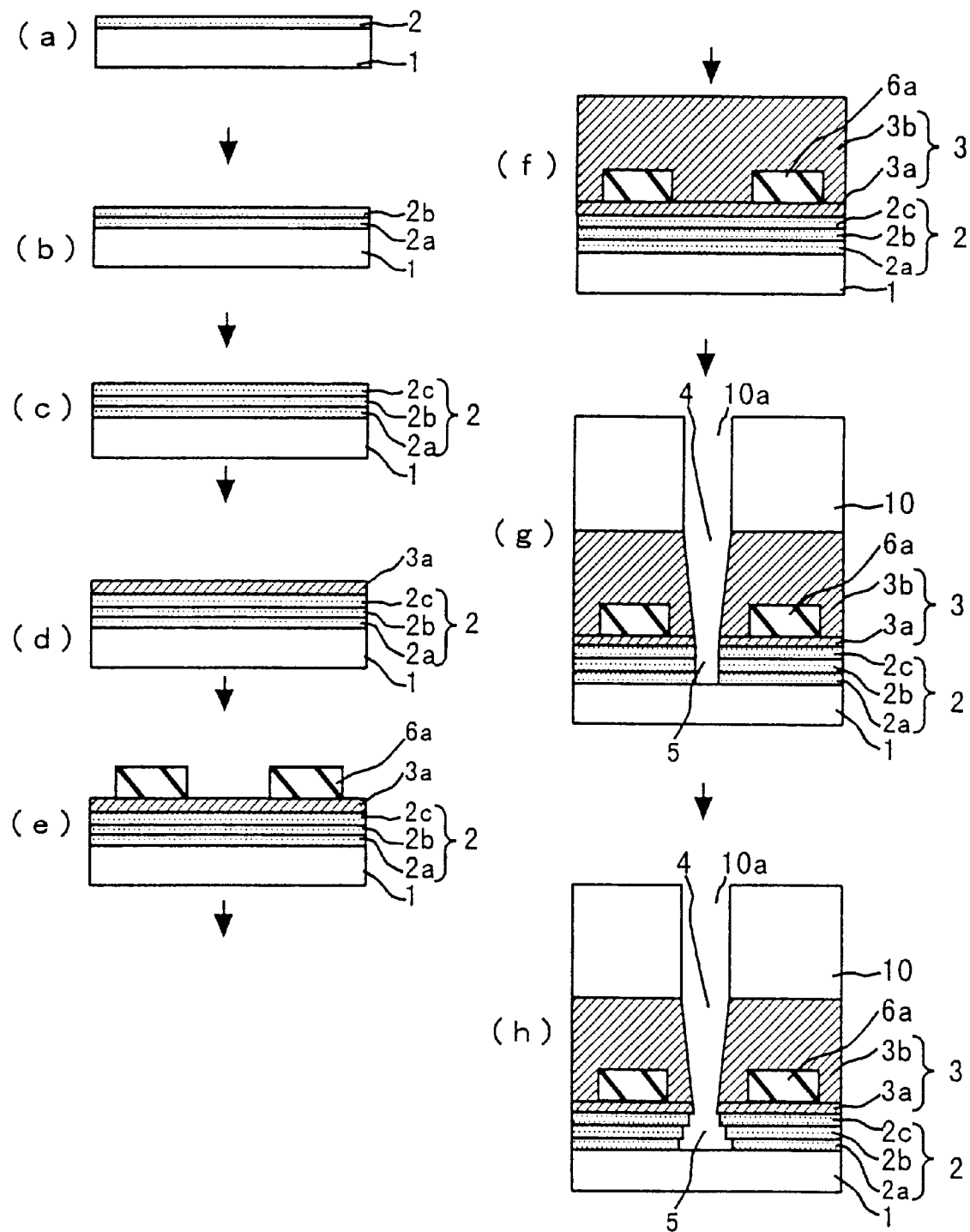
FIGS. 18(a) to 18(h) are sectional views illustrating steps of a semiconductor device fabricating method in the eighteenth embodiment according to the present invention.

FIGS. 18(*a*) to 18(*h*) are sectional views illustrating steps of a semiconductor device fabricating method in the eighteenth embodiment according to the present invention. The semiconductor device fabricating method in the eighteenth embodiment will be described hereinafter with reference to FIGS. 18(*a*) to 18(*h*).

Steps shown in FIGS. 18(*a*) to 18(*d*) of the semiconductor device fabricating method are the same as those shown in and previously described with reference to FIGS. 16(*a*) to 16(*d*) and hence the description of those steps will be omitted. A first upper silicon dioxide film 3a shown in FIG. 18(*d*) corresponds to the upper silicon dioxide film 3 shown in FIG. 16(*d*).

As shown in FIG. 18(*e*), a plurality of wiring lines 6a, i.e., conductive elements, are formed on the first upper silicon dioxide film 3a.

As shown in FIG. 18(*f*), a thick second upper silicon dioxide film 3b is deposited over the first upper silicon dioxide film 3a and the wiring lines 6a. Usually, the upper silicon dioxide films 3a and 3b have the same impurity concentration. The upper silicon dioxide films 3a and 3b constitute a multilayer upper silicon dioxide film 3. The wiring lines 6a are buried in the multilayer upper silicon dioxide film 3.

Then, as shown in FIG. 18(*g*), the surface of the upper silicon dioxide film 3 is coated with a resistant film 10, an opening 10a is formed in the resistant film 10, and portions of the silicon dioxide films 3 and 2 corresponding to the opening 10a are removed by anisotropic etching to form a contact hole 4 having a bottom portion 5.

Then, a process shown in FIG. 18(*h*) is carried out. The process shown in FIG. 18(*h*) is the same as that shown in FIG. 16(*f*) and hence the description thereof will be omitted.

Subsequently, a contact is formed in the thus formed contact hole 4.

The semiconductor device in the sixth embodiment shown in FIG. 6 is fabricated by this semiconductor device fabricating method.

Since the wiring lines 6a are buried in the second upper silicon dioxide film 3b, which is etched at a relatively low etching rate, the contact hole 4 can be formed in a narrow region between the adjacent wiring lines 6a, and the contact is formed in the contact hole 4.

Figure 16:
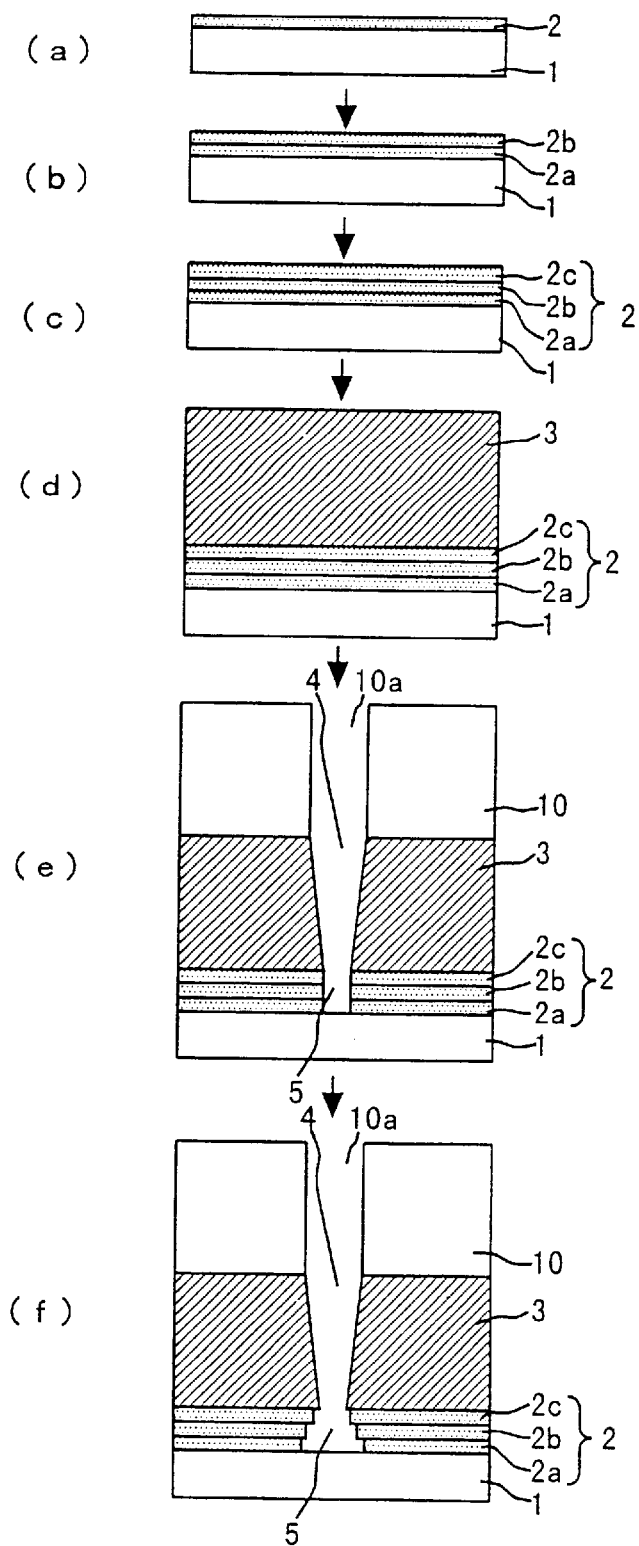
FIGS. 16(a) to 16(f) are sectional views illustrating steps of a semiconductor device fabricating method in the sixteenth embodiment according to the present invention.

The effect of the semiconductor device fabricating method in surely forming the contact hole 4 of a large aspect ratio is the same as that of the semiconductor device fabricating method in the sixteenth embodiment shown in FIGS. 16 (a) to 16(f) and hence the description thereof will be omitted.

The semiconductor device fabricating method in the eighteenth embodiment is particularly effective when applied to the fabrication of a DRAM using the wiring lines 6a formed in the interlayer insulating film as bit lines.

If the steps of forming the multilayer lower silicon dioxide film 2 shown in FIGS. 18(a) to 18(c) are replaced with the step of forming the single-layer lower silicon dioxide film 2 of the fifteenth embodiment shown in FIG. 15(a), the semiconductor device in the fifth embodiment previously described with reference to FIG. 5 can be fabricated.

If the step of forming the first upper silicon dioxide film 3a shown in FIG. 18(d) is omitted, the semiconductor device in the fourth embodiment previously described with reference to FIG. 4 can be fabricated.

Nineteenth Embodiment

FIGS. 19(a) to 19(j) are sectional views illustrating steps of a semiconductor device fabricating method in the nineteenth embodiment according to the present invention. The semiconductor device fabricating method in the nineteenth embodiment will be described hereinafter with reference to FIGS. 19(a) to 19(j).

Figure 19:
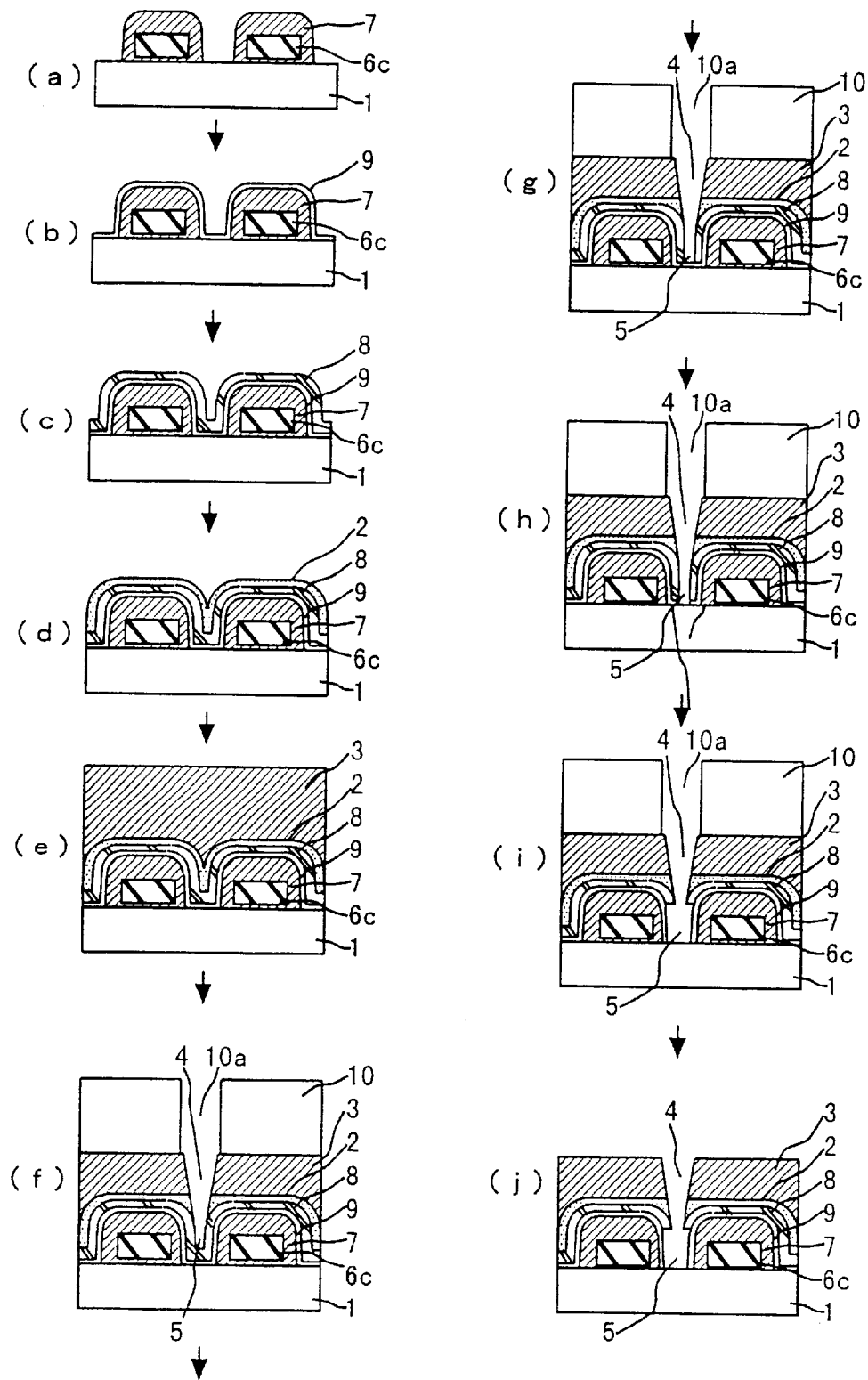
FIGS. 19(a) to 19(j) are sectional views illustrating steps of a semiconductor device fabricating method in the nineteenth embodiment according to the present invention.
Figure 22A:
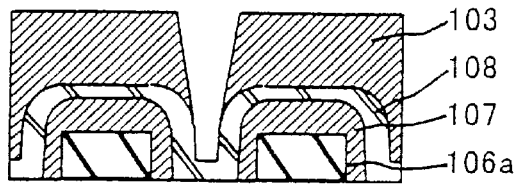
FIGS. 22(a) to 22(c) illustrate self-alignment contact structures employing a nitride film.
Figures 22B, 22C:
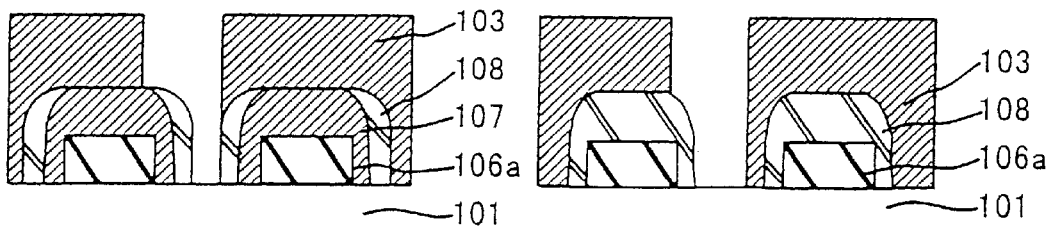
Figures 23A, 23B:
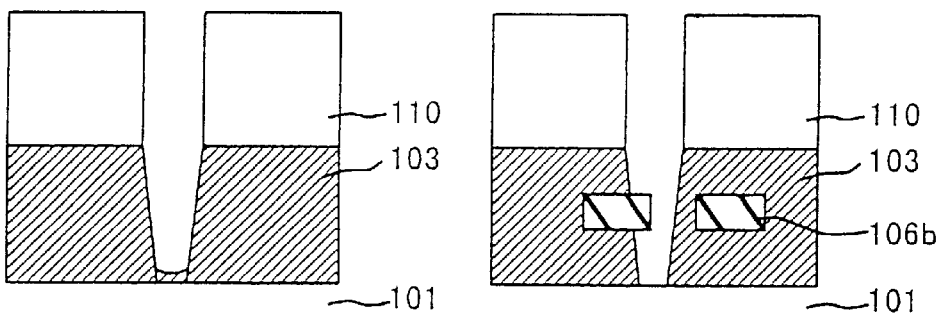
FIGS. 23(a) and 23(b) are sectional views of contact holes for illustrating problems that arise when forming a contact hole of a large aspect ratio.
Figures 24A, 24B:
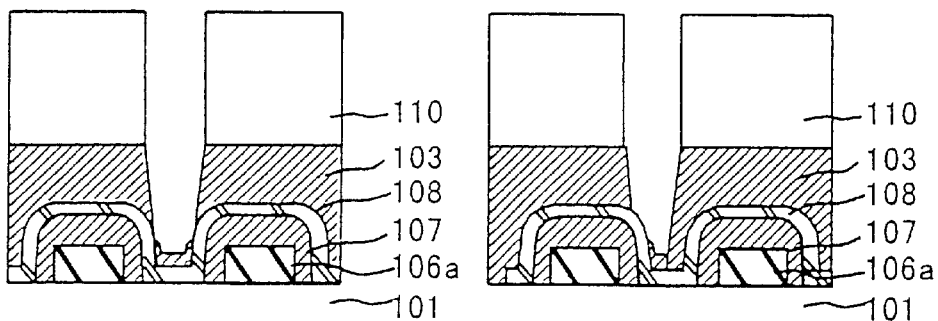
FIGS. 24(a) and 24(b) are views for illustrating problems that arise in forming a contact between wiring lines in the self-alignment contact structure of a blanket SiN system.

As shown in FIG. 19(a), lower wiring line 6c are formed on a semiconductor wafer 1, such as a silicon wafer, and an undoped silicon dioxide film 7 is formed over the semiconductor wafer 1 so as to cover the lower wiring lines 6c. Then, as shown in FIG. 19(b), a thin undoped silicon dioxide film 9 is formed so as to cover the silicon dioxide film 7.

Then, as shown in FIG. 19(c), an etching stopper film 8 of SiN is formed over the thin silicon dioxide film 9.

As shown in FIG. 19(d), a lower silicon dioxide film 2, relatively heavily doped with an impurity, such as B or P, is formed over the etching stopper film 8.

Then, as shown in FIG. 19(e), an upper silicon dioxide film 3, relatively lightly doped with an impurity, such as B or P, or not doped at all, is formed over the lower silicon dioxide film 2. The silicon dioxide film 2 and 3 constitute an interlayer insulating film.

Then, as shown in FIG. 19(f), the surface of the upper silicon dioxide film 3 is coated with a resistant film 10, an opening 10a is formed in the resistant film 10, and portions of the silicon dioxide films 3 and 2 corresponding to the opening 10a are removed by anisotropic dry etching to form a contact hole 4 having a bottom portion 5. The contact hole 4 is formed in a region corresponding to a portion of the etching stopper film 8, between portions of the same covering the adjacent lower wiring lines 6c.

Then, as shown in FIG. 19(g), the portion of the SiN etching stopper film 8 covering the bottom surface of the contact hole 4, is removed by anisotropic dry etching.

Then, as shown in FIG. 19(h), the portion of the thin silicon dioxide film 9 covering the bottom surface of the contact hole 4 is removed by anisotropic dry etching.

Then, as shown in FIG. 19(i), the portion of the SiN etching stopper film 8 covering the side surface of the bottom portion 5 of the contact hole 4 is removed by isotropic etching to expand the bottom portion 5 laterally.

Then, the resistant film 10 is removed as shown in FIG. 19(j).

The step shown in FIG. 19(i) may be carried out before the step shown in FIG. 19(h). In the step shown in FIG. 19(g), the portion of the SiN etching stopper film 8 covering the bottom surface of the contact hole 4 is removed by anisotropic dry etching. Then, the portion of the SiN etching stopper film 8 covering the side surface of the contact hole 4, is removed by isotropic etching to expand the contact hole 4 laterally under conditions where the thin silicon dioxide film 9 is not etched. Thereafter, the portion of the thin silicon dioxide film 9 covering the bottom of the contact hole 4 is removed by anisotropic dry etching. When the films are thus etched, the thin silicon dioxide film 9 remains on the semiconductor wafer 1 after the SiN etching stopper film 8 has been etched, and then the thin silicon dioxide film 9 is removed by highly selective etching, so that the semiconductor wafer 1 is not etched and a stable contact characteristic can be secured.

The semiconductor device in the eleventh embodiment, previously described with reference to FIG. 11, can be fabricated by this semiconductor device fabricating method.

If the step of forming the thin silicon dioxide film 9 is omitted, and if the SiN etching stopper film 8 is formed only on the side surfaces of the silicon dioxide film 7, instead of forming the SiN etching stopper film 83 over the entire surface of the silicon dioxide film 7 in the step shown in FIG. 19(c), the semiconductor device in the twelfth embodiment previously described with reference to FIG. 12 is fabricated.

If the steps shown in FIGS. 19(a) and 19(b) for forming the silicon dioxide film 7 and the thin silicon dioxide film 9 are omitted, the semiconductor devices in the thirteenth and the fourteenth embodiment previously described with reference to FIGS. 13 and 14 can be fabricated.

Since this semiconductor device fabricating method forms the lower silicon dioxide film 2, which is etched at a high etching rate, as a lower layer of the interlayer insulating between the portions of the SiN etching stopper film 8 covering the lower wiring lines 6c, any etching stop phenomenon does not occur in the bottom portion 5 of the contact hole 4, in which a RIE lag is liable to occur.

Accordingly, the contact hole 4 of a large aspect ratio can be formed between the adjacent lower wiring lines 6c, and the yield of the contact hole forming process can be improved. Since a contact having a bottom surface with an increased contact area and a reduced resistance can be formed, the electrical characteristics of the contact is improved.

Since the lower wiring lines 6c are covered with a film different from the lower silicon dioxide film 2, the accidental connection of the lower wiring lines 6c with the contact can be prevented.

As mentioned above, this semiconductor device fabricating method is particularly effective in forming the SiN etching stopper film 8 around or over the plurality of lower wiring lines 6c, and forming the contact between adjacent portions of the SiN etching stopper film 8.

This semiconductor device fabricating method is greatly effective in fabricating a DRAM, using the lower wiring lines 6c as word lines.

Although the contact is connected to the silicon wafer in the foregoing embodiments, the present invention is appli cable to an interlayer insulating film of appropriate material formed on a semiconductor wafer other than the silicon wafer.

Although the contacts of the foregoing embodiments are connected to the semiconductor wafer 1, the contacts may be connected to a conductive layer, or the like, included in the semiconductor device. In this specification, layers to which the contact is to be connected are referred to generally as semiconductor base layers.

In the foregoing embodiments, the contact is formed in the contact hole, having a diametrically expanded bottom portion contiguous with the semiconductor base layer. The semiconductor device fabricating method in the fifteenth embodiment is applicable to forming such a contact hole, defined by a side surface having an overhanging portion.

The effects and advantages of the present invention are reviewed as follows.

As is apparent from the foregoing description, according to the present invention, a contact hole of a large aspect ratio for forming an interlayer contact can surely be formed, and Et semiconductor device provided with contacts having a bottom surface of an increased contact area can be fabricated. The contact has a reduced resistance and improved electrical characteristics.

In a semiconductor device provided with wiring lines buried in an interlayer insulating film, a contact can be formed so that the same may not accidentally be connected to the wiring lines.

In a semiconductor device provided with wiring lines formed on a semiconductor base layer, a contact hole of a large aspect ratio can surely be formed between the adjacent wiring lines, and a contact can be formed in the contact hole.

The semiconductor device fabricating method of the present invention is capable of fabricating such an improved semiconductor device, of surely forming a contact hole of a large aspect ratio and of improving the yield of a contact hole forming process.

Obviously, numerous additional modifications and variations of the present invention are possible in light of the above teachings. It is therefore to be understood that within the scope of the appended claims, the present invention may be practiced otherwise than as specifically described herein.

What is claimed is:

1. A semiconductor device fabricating method comprising:

a first step of forming a plurality of conductive elements on a surface of a semiconductor base layer having a thin insulating film thereon, upper surfaces and side surfaces of said conductive elements being covered with a silicon oxide film;

a second step of forming an etching resistant film on the surface of said semiconductor base layer and the side surfaces of said conductive elements;

a third step of forming an interlayer insulating film so as to cover said etching resistant film, the interlayer insulating film comprising a lower interlayer contiguous with an upper interlayer, the lower interlayer having a higher etching rate than the upper interlayer;

a fourth step of forming a hole in said interlayer insulating film, reaching at least to said etching resistant film between said plurality of conductive elements;

a fifth step of extending said hole by removing said etching resistant film to reach said semiconductor base layer for forming a contact hole to said semiconductor base layer; and a sixth step of expanding a bottom portion of the hole in a lateral direction by isotropic etching.

2. The semiconductor device fabricating method according to claim 1, further comprising, following said first step, a step of forming a silicon dioxide film over said semiconductor base layer and on the upper and side surfaces of said plurality of conductive elements.

3. The semiconductor device fabricating method according to claim 1, wherein the material for said etching resistant film and said interlayer insulating film is different.

4. The semiconductor device fabricating method according to claim 1, wherein said interlayer insulating film is formed by silicon oxide film having different impurity densities respectively in the lower interlayer and the upper interlayer.

* * * * *